(12) United States Patent
Van Kampen et al.

(10) Patent No.: US 10,896,787 B2
(45) Date of Patent: Jan. 19, 2021

(54) CONTACT IN RF-SWITCH

(71) Applicant: CAVENDISH KINETICS, INC., San Jose, CA (US)

(72) Inventors: Robertus Petrus Van Kampen, S-Hertogenbosch (NL); James Douglas Huffman, McKinney, TX (US); Mickael Renault, San Jose, CA (US); Shibajyoti Ghosh Dastider, Rocklin, CA (US); Jacques Marcel Muyango, Rocklin, CA (US)

(73) Assignee: Cavendish Kinetics, Inc., San Jose, CA (US)

( * ) Notice: Subject to any disclaimer, the term of this patent is extended or adjusted under 35 U.S.C. 154(b) by 7 days.

(21) Appl. No.: 15/771,026

(22) PCT Filed: Nov. 14, 2016

(86) PCT No.: PCT/US2016/061934
§ 371 (c)(1),
(2) Date: Apr. 25, 2018

(87) PCT Pub. No.: WO2017/087339
PCT Pub. Date: May 26, 2017

(65) Prior Publication Data
US 2018/0308645 A1    Oct. 25, 2018

Related U.S. Application Data

(60) Provisional application No. 62/256,012, filed on Nov. 16, 2015.

(51) Int. Cl.
*H01H 1/00*    (2006.01)
*B81B 3/00*    (2006.01)
(Continued)

(52) U.S. Cl.
CPC ......... *H01H 1/0036* (2013.01); *B81B 3/0021* (2013.01); *B81C 1/00142* (2013.01);
(Continued)

(58) Field of Classification Search
CPC ............ B81B 2201/016; B81B 3/0021; B81C 1/00142; H01H 1/0036; H01H 2001/0084; H01H 59/00
(Continued)

(56) References Cited

U.S. PATENT DOCUMENTS 6,798,029 B2*  9/2004  Volant ................ H01H 59/0009
                                                 257/415
8,797,127 B2*  8/2014  Chu .......................... H01G 5/18
                                                  335/78
(Continued)

FOREIGN PATENT DOCUMENTS

CN    101018734 A    8/2007
CN    103959418 A    7/2014
(Continued)

OTHER PUBLICATIONS

Office Action issued in counterpart Chinese Patent Application No. 201680066391.4, dated Feb. 25, 2019 (14 pages).
(Continued)

*Primary Examiner* — Bernard Rojas
(74) *Attorney, Agent, or Firm* — Withrow & Terranova, P.L.L.C.

(57) ABSTRACT

The present invention generally relates to a mechanism for making a MEMS switch that has a robust RF-contact by avoiding currents to run through a thin sidewall in a via from the RF-contact to the underlying RF-electrode.

19 Claims, 7 Drawing Sheets

(51) Int. Cl.
*H01H 59/00* (2006.01)
*B81C 1/00* (2006.01)
(52) U.S. Cl.
CPC ....... *H01H 59/00* (2013.01); *B81B 2201/016* (2013.01); *H01H 2001/0084* (2013.01)
(58) Field of Classification Search
USPC ............................................ 335/78; 200/181
See application file for complete search history.

(56) References Cited

U.S. PATENT DOCUMENTS

| | | | |
|---|---|---|---|
| 2012/0125747 A1* | 5/2012 | Chu | H01G 5/18 200/181 |
| 2014/0202838 A1 | 7/2014 | Sano et al. | |
| 2014/0300249 A1 | 10/2014 | Van Kampen et al. | |
| 2016/0240320 A1* | 8/2016 | Renault | H01G 5/011 |

FOREIGN PATENT DOCUMENTS

| | | |
|---|---|---|
| JP | H0822727 A | 1/1996 |
| JP | 2003249136 A | 2/2002 |
| JP | 2011181315 A | 9/2011 |
| WO | 2004015728 A1 | 2/2004 |
| WO | 2011036808 A1 | 3/2011 |
| WO | 2014209556 A1 | 12/2014 |
| WO | 2015017743 A1 | 2/2015 |

OTHER PUBLICATIONS

International Search Report and Written Opinion dated Jan. 25, 2017, in corresponding application No. PCT/US2016/061934.
Office Action issued in corresponding Chinese Patent Application No. 2016800663914, dated Sep. 29, 2019 (16 pages).
Examination Report for European Patent Application No. EP16804968.2, dated Mar. 25, 2020, 7 pages.
International Preliminary Report on Patentability for International Patent Application No. PCT/US2016/061934, dated May 31, 2018, 8 pages.
Notification to Grant for Chinese Patent Application No. 201680066391.4, dated May 18, 2020, 6 pages.
Notification of Reasons for Refusal for Japanese Patent Application No. 2018-525406, dated Sep. 23, 2020, 13 pages.

* cited by examiner

CONTACT IN RF-SWITCH

BACKGROUND OF THE DISCLOSURE

Field of the Disclosure

Embodiments of the present disclosure generally relate to a technique for improving the current handling of the RF-contact in MEMS switches.

Description of the Related Art

A MEMS resistive switch contains a movable plate that moves by applying a voltage to an actuation electrode. Once the electrode voltage reaches a certain voltage oftentimes referred to as a snap-in voltage, the plate moves towards the electrode. The plate moves back to the original position once the voltage is lowered to a release voltage. The release voltage is typically lower than the snap-in voltage due to the higher electrostatic forces when the plate is close to the actuation electrode and due to stiction between the plate and the surface to which the plate is in contact once moved closer to the electrode. The spring constant of the MEMS device sets the value of the pull in voltage and pull off voltage.

When the plate is actuated down, it lands on a contact electrode to which it makes an ohmic contact. To achieve a low repeatable contact resistance a high contact force is required between the plate and the contact-electrode. To achieve this contact force at reasonable operating voltages, the gap between the plate and the pull-down electrode in the landed state needs to be small. As a result the contact electrode is typically a thin metal layer. This thin contact layer typically is connected to an underlying RF-electrode through a step-down via.

In operating a MEMS resistive switch, where a plate moves between a first position and a second position making electrical contact with a landing electrode, high electrical powers applied across the switch causes large current flows through the electrical contact. The high currents running through the contact-layer on the thin sidewall can lead to destructive failures in the contact.

Therefore, there is a need in the art for a MEMS switch that can carry large currents without leading to a destructive failure of the RF-contact.

SUMMARY OF THE DISCLOSURE

The present disclosure generally relates to a modified RF-contact design that does not suffer from a high current running through the thin sidewall in the via connection between the RF-contact and the underlying RF-electrode.

In one embodiment, a MEMS device comprises a substrate having a plurality of electrodes formed therein, wherein the plurality of electrodes includes at least an anchor electrode, a pull-down electrode and an RF electrode; an insulating layer disposed over the substrate and the plurality of electrodes, wherein the insulating layer has a first opening formed therethrough to expose the anchor electrode and a second opening formed therethrough to expose the RF electrode; a contact layer, wherein the contact layer includes a first portion disposed within the first opening and in contact with the anchor electrode, a second portion disposed within the second opening and in contact with the RF electrode and wherein the contact layer is electrically conductive; and a switching element disposed over the dielectric layer, wherein the switching element includes an anchor portion in contact with the first portion of the contact layer, a leg portion and a bridge portion and wherein the bridge portion is movable from a first position spaced from the second portion of the contact layer and a second position in contact with the second portion of the contact layer.

In another embodiment, a method of fabricating a MEMS device comprises depositing an insulating layer over a substrate, the substrate having a plurality of electrodes formed therein, wherein the plurality of electrodes includes at least an anchor electrode, a pull-in electrode and an RF electrode; removing at least a portion of the insulating layer to form a first opening that exposes at least a portion of the anchor electrode and to form a second opening that exposes at least a portion of the RF electrode; depositing a contact layer over the insulating layer and within the first opening on the anchor electrode and within the second opening on the RF electrode; removing a portion of the contact layer, wherein a first portion remains within the first opening on the anchor electrode and wherein a second portion remains within the second opening on the RF electrode; and forming a switching element over the substrate, wherein the switching element includes an anchor portion that is coupled to the first portion of the contact layer, wherein the switching element also includes a leg portion and bridge portion, wherein the switching element is movable from a first position spaced from the second portion of the contact layer and a second position in contact with the second portion of the contact layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to a modified RF-contact design that does not suffer from a high current running through the thin sidewall in the via connection between the RF-contact and the underlying RF-electrode.

Figure 1:
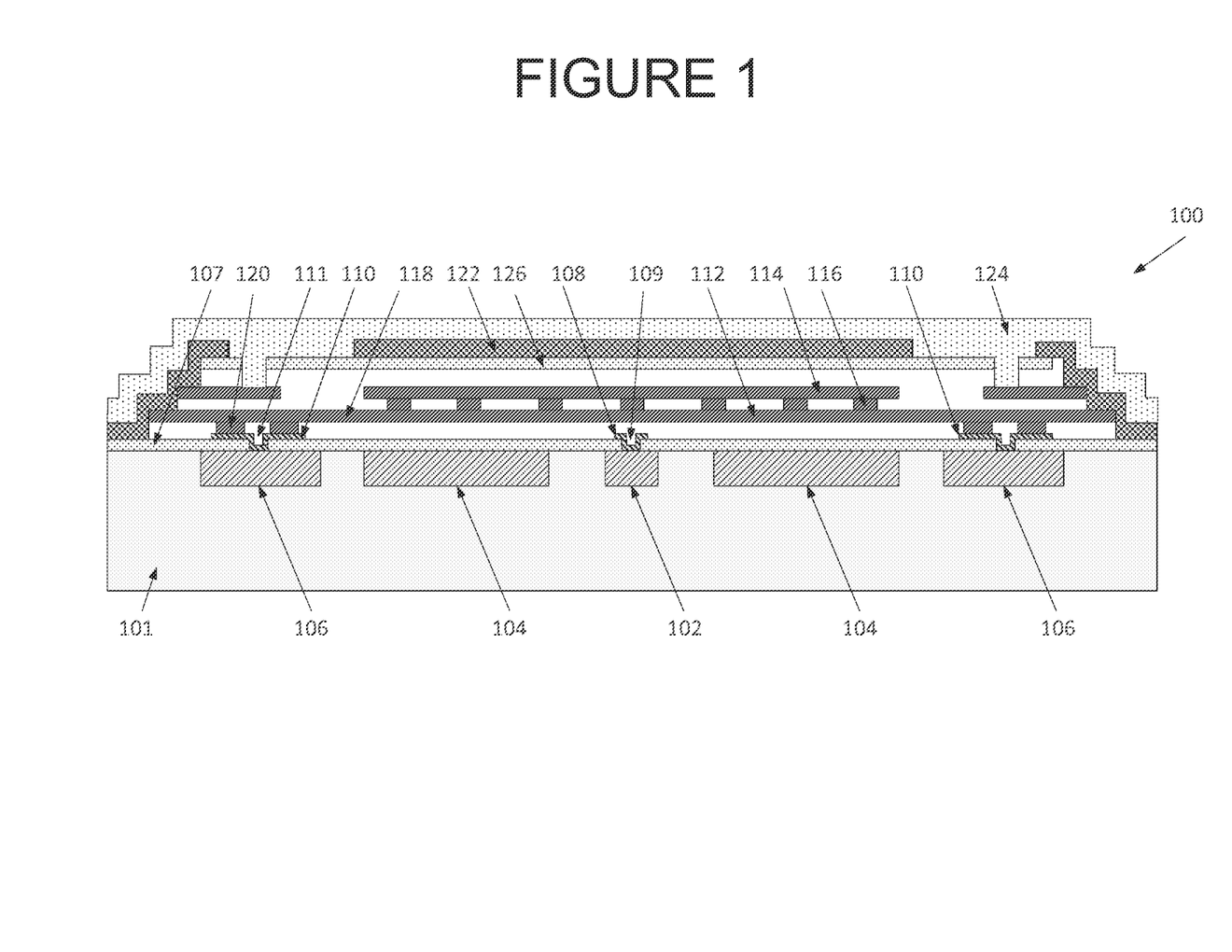
FIG. 1 is a schematic cross-sectional view of a MEMS ohmic switch.

FIG. 1 shows a cross-section view of an ohmic MEMS switch 100. The switch 100 contains an RF electrode 102, pull-down electrodes 104 and anchor electrodes 106 located on substrate 101. The electrodes are covered with a dielectric layer 107 to avoid a short-circuit between the MEMS switch and the pull-down electrode in the pulled-down state.

Suitable materials for the electrically insulating layer 107 include silicon based materials including silicon-oxide, silicon-dioxide, silicon-nitride and silicon-oxynitride. The thickness of the insulating layer 107 is typically in the range of 50 nm to 150 nm to limit the electric field in the insulating layer 107. On top of the RF electrode 102 is the RF contact 108 which is connected to the RF electrode 102 through a via opening 109 in the insulating layer 107. The switch element contains a stiff bridge consisting of conductive layers 112, 114 which are joined together using an array of filled vias 116. This allows for a stiff plate-section and compliant legs to provide a high contact-force while keeping the operating voltage to acceptable levels. The MEMS bridge is suspended by legs 118 formed in the lower layer 112 and/or in the upper layer 114 of the MEMS bridge and anchored with filled via 120 onto conductor 110 which is connected to the anchor electrode 106 through a via opening 111 in the insulating layer 107.

Above the MEMS bridge there is a dielectric layer 126 which is capped with metal 122 which is used to pull the MEMS up to the roof for the off state. Dielectric layer 126 avoids a short-circuit between the MEMS bridge and the pull-up electrode in the actuated-up state and limits the electric fields for high reliability. Moving the device to the top helps reduce the capacitance of the switch in the off state. The cavity is sealed with dielectric layer 124 which fills the etch holes used to remove the sacrificial layers. It enters these holes and helps support the ends of the cantilevers, while also sealing the cavity so that there is a low pressure environment in the cavities.

RF contact 108 is conductive and makes ohmic contact with the conducting underside of the MEMS plate 112 once the device is pulled down by applying a high-enough voltage on the pull-down electrode 104. Typical materials used for the RF contact 108 and conductor 110 include Ti, TiN, TiAl, TiAlN, AlN, Al, W, Pt, Ir, Rh, Ru, RuO$_2$, ITO and Mo and combinations thereof.

In order to obtain a low contact resistance a high contact force must be generated between the MEMS plate 112 and the contact electrode 108. To obtain such a high contact force at reasonable operating voltages, the conducting layer is typically thin in the 30 nm to 100 nm range, so that once the plate 112 is landed on the contact it is close to the PD-electrode. The thin conducting layer will also have a thin sidewall inside the via opening 109 which connects it to the RF-electrode 102 located underneath the RF contact 108. Because the RF contact 108 is so thin, when running a high-current through the RF contact 108, this can lead to a failure of the RF contact 108.

Figure 2:
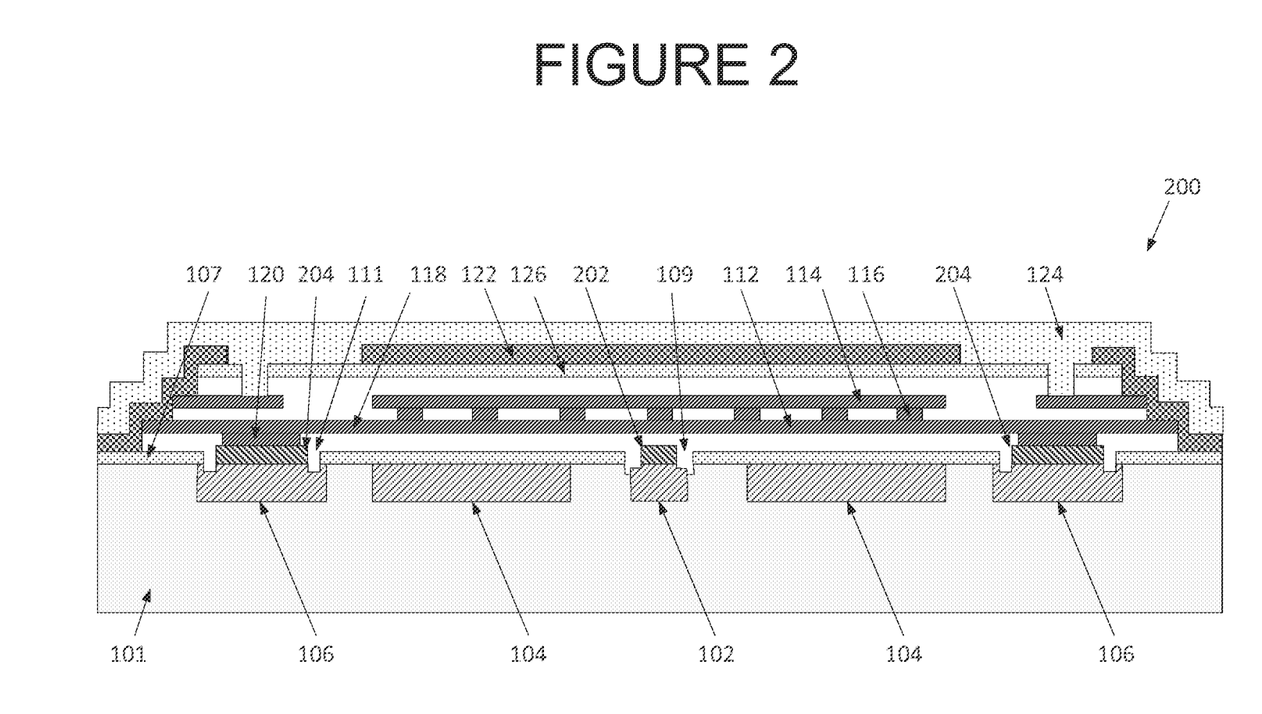
FIG. 2 is a schematic cross-sectional view of a MEMS ohmic switch according to one embodiment.

FIG. 2 shows a cross-section view of an ohmic MEMS switch 200 according to one embodiment. The switch 200 contains an improved RF contact 202 which sits directly on top of the RF electrode 102 and an improved anchor contact 204 which sits directly on top of the anchor electrode 106. This is achieved by sizing the via opening 109 to be larger than the RF contact 202 and by sizing the via opening 111 to be larger than the anchor contact 204.

The thickness of the RF contact 202 and anchor contact 204 now has to be increased by the thickness of the dielectric layer 107, so that these contacts protrude by the same amount over the dielectric layer 107 as in FIG. 1. Any current injected into these thicker contacts now has a path straight down to the underlying electrodes 102, 106 without having to travel through a thin sidewall. This improves the reliability of the RF contacts which now can handle more current.

Figure 3A:
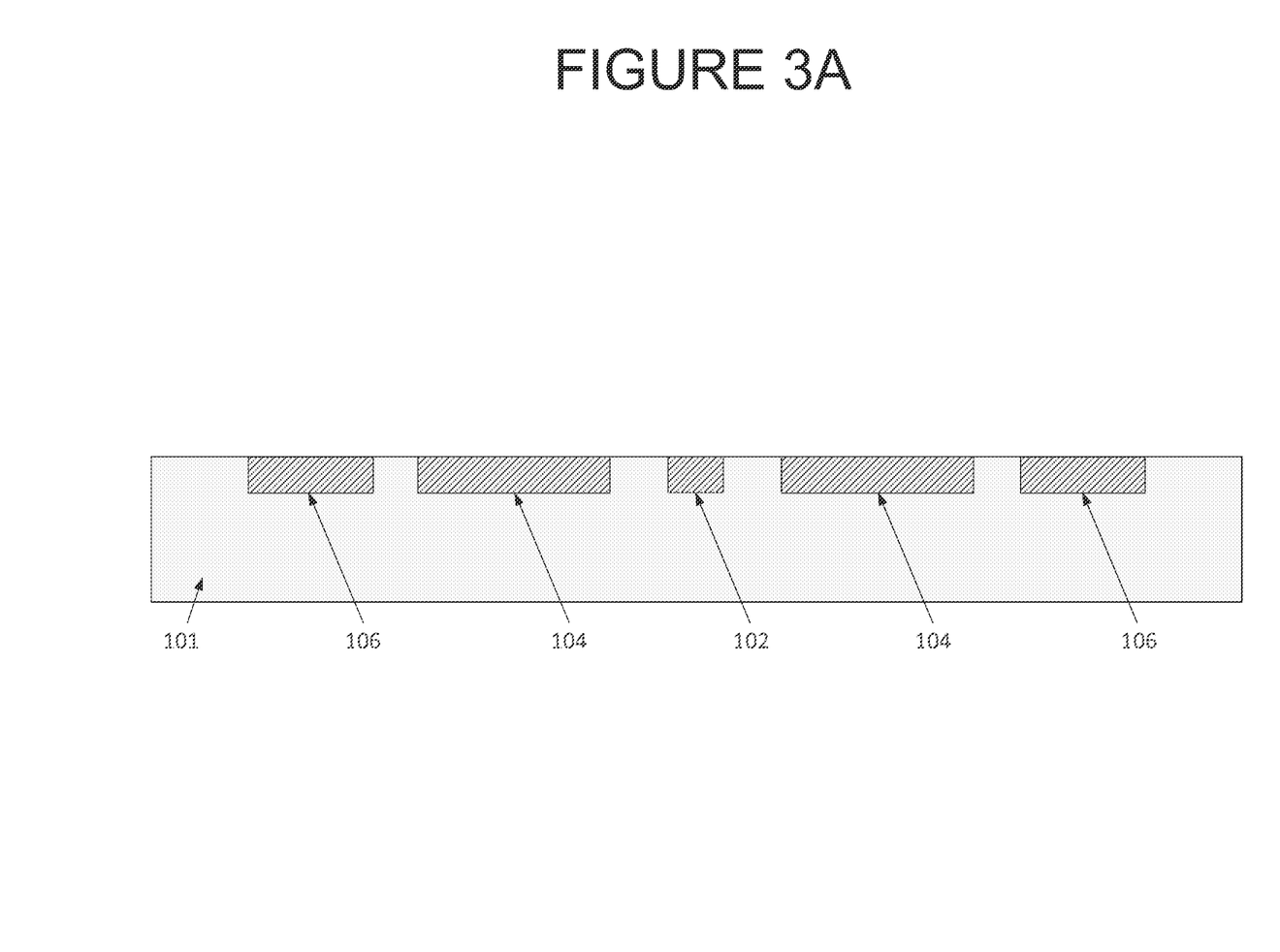
FIGS. 3A-3E are schematic illustrations of a MEMS ohmic switch at various stages of fabrication according to one embodiment.

FIGS. 3A-3E are schematic illustrations of the MEMS ohmic switch at various stages of fabrication according to one embodiment. As shown in FIG. 3A, the substrate 101 has a plurality of electrodes including the RF electrode 102, pull-in electrodes 104 and the anchor electrodes 106 formed therein. It is to be understood that the substrate 101 may comprise a single layer substrate or a multi-layer substrate such as a CMOS substrate having one or more layers of interconnects. Additionally, suitable materials that may be used for the electrodes 102, 104, 106 include titanium-nitride, aluminum, tungsten, copper, titanium, and combinations thereof including multi-layer stacks of different material.

Figure 3B:
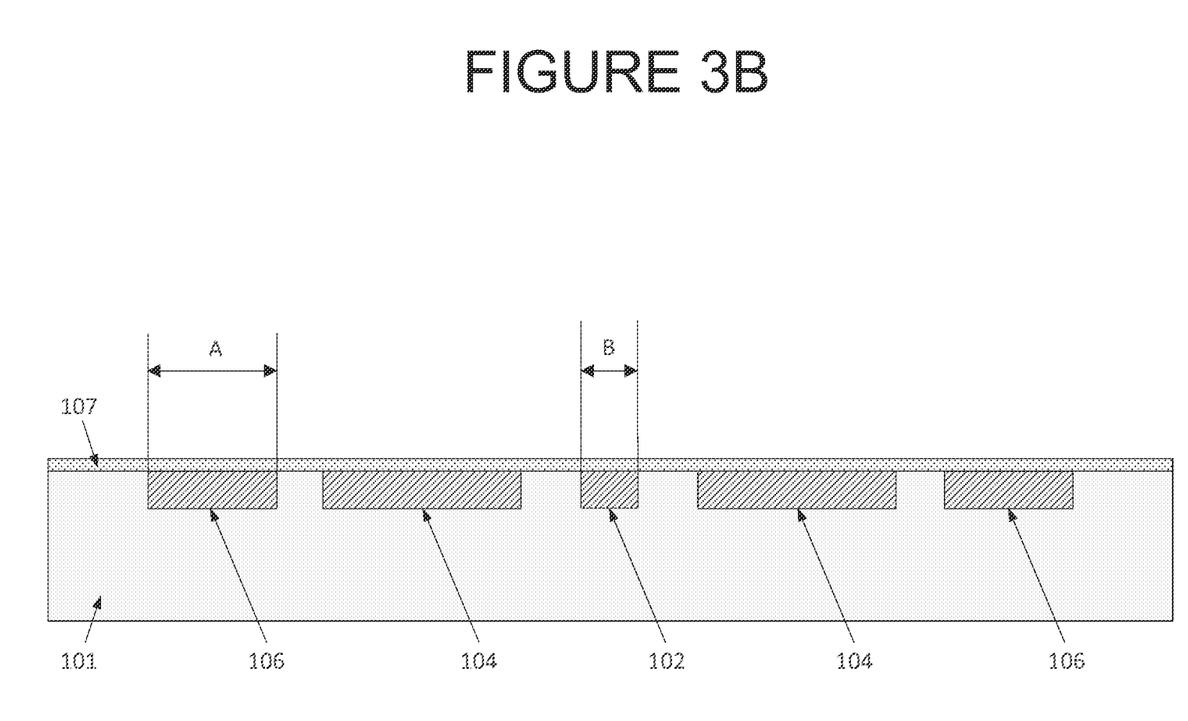

As shown in FIG. 3B, an electrically insulating layer 107 is then deposited over the electrodes 102, 104, 106. Suitable materials for the electrically insulating layer 107 include silicon based materials including silicon-oxide, silicon-dioxide, silicon-nitride and silicon-oxynitride. As shown in FIG. 3B, the anchor electrode 106 has a width shown by arrows "A", and the RF electrode 102 has a width as shown by arrow "B".

Figure 3C:
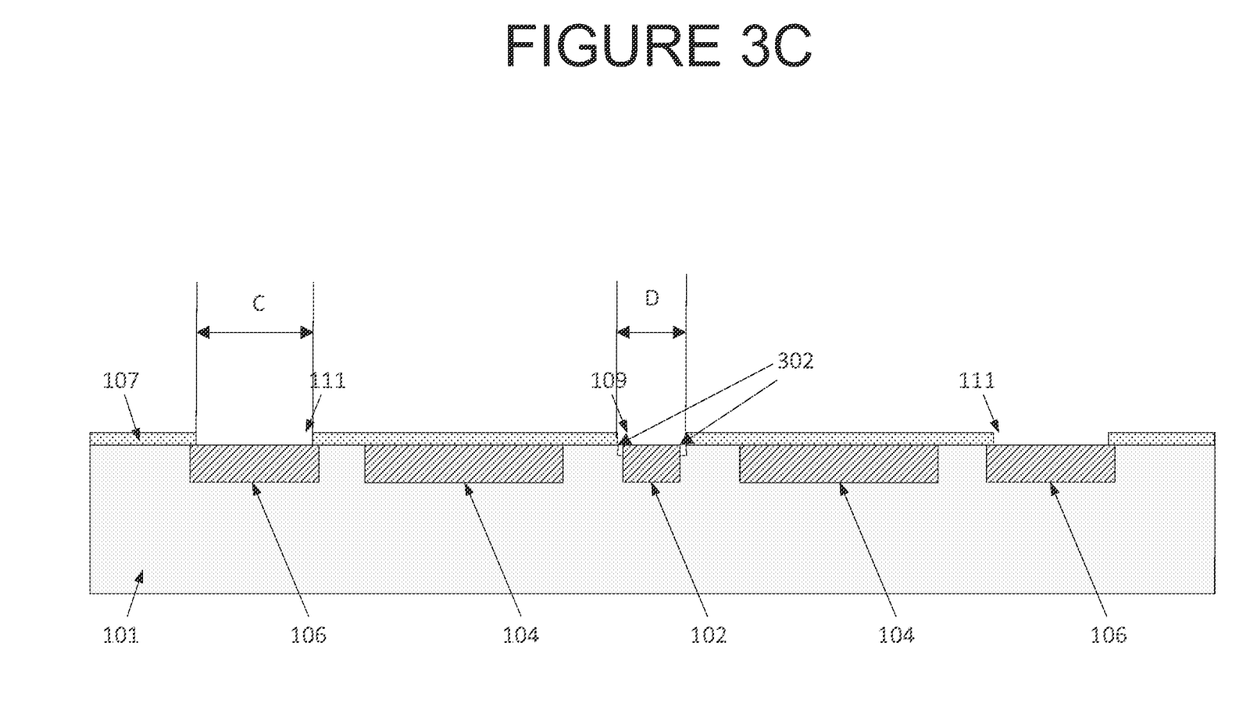

As shown in FIG. 3C, the electrically insulating layer 107 is removed over the RF electrode 102 and over portions of the anchor electrode 106 to create openings 109, 111. When the opening is smaller than the underlying electrode, such as opening 111 shown above electrode 106 as arrows "C", then the dielectric etch that removes the insulating layer 107 will stop on the underlying electrode 106. When the opening is larger than the underlying electrode, such as opening 109 above electrode 102 as shown by arrows "D", then the dielectric etch that removes the insulating layer 107 will also etch a little bit extra dielectric located next to the electrode 102 as shown by item 302 so that the RF electrode 102, and ultimately the RF contact 202, are spaced from the dielectric layer 107.

Figure 3D:
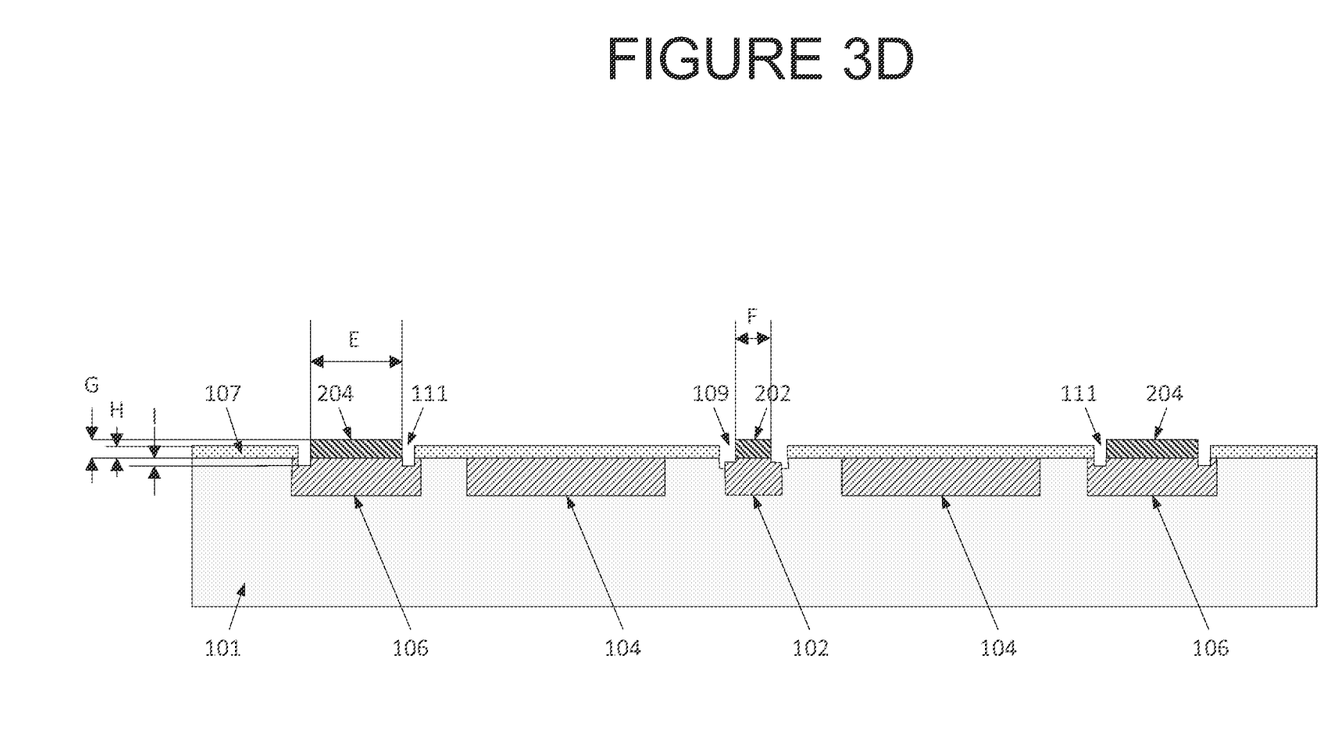
Figure 3E:
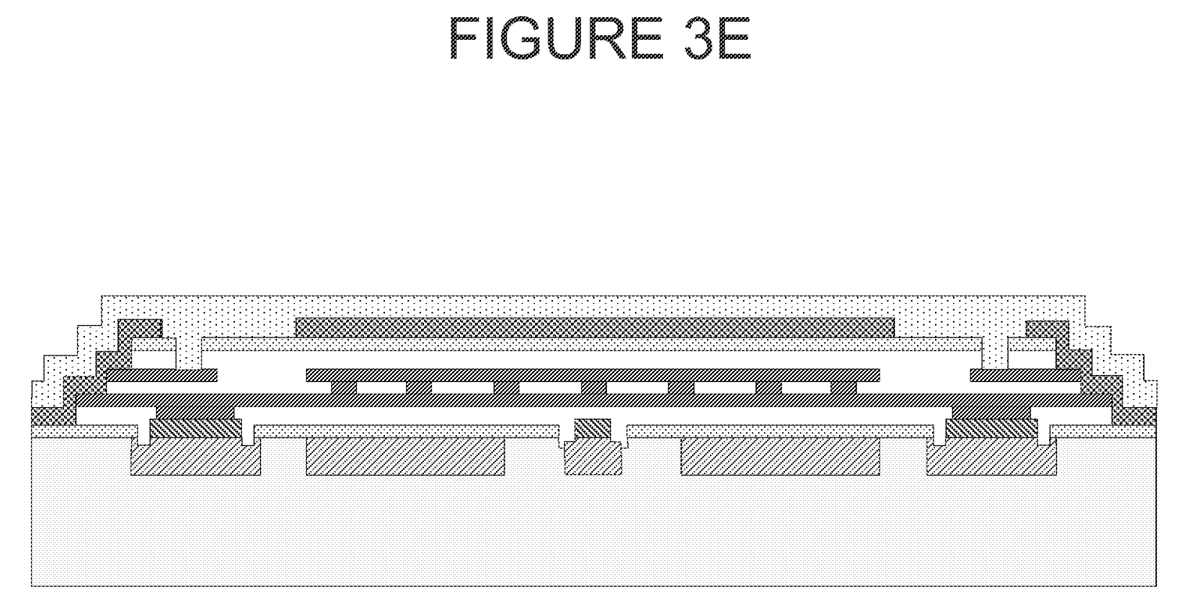

As shown in FIG. 3D, the RF contact 202 and anchor contact 204 are formed by deposition and patterning of a suitable conductive material required to provide a good ohmic contact to the MEMS switch fabricated above it in a later stage. Typical materials used for the RF contact 202 and anchor contact 204 include Ti, TiN, TiAl, TiAlN, AlN, Al, W, Pt, Ir, Rh, Ru, RuO$_2$, ITO and Mo and combinations thereof. The width of the RF contact 202 and anchor contact 204 is typically smaller than the underlying electrode 102, 106 as shown by arrows "E" and "F". As shown by arrows "G", the thickness of the RF contact 202 and anchor contact 204 is greater than the thickness of the insulating layer 107 shown by arrows "H". When etching the contacting electrode also some portion of the exposed underlying electrode 102, 106 is etched as shown by arrows "I" such that the anchor electrode 106 and the RF electrode 102 have a first thickness at the location of the anchor contact 204 and RF contact 202 respectively and a second thickness adjacent the contacts 202, 204, but since the thickness of the RF contact 202 and anchor contact 204 is much less than the thickness of the underlying electrodes 102, 106 this poses no problem in the controllability of the process. In this way small RF contacts 202 are generated that can carry the current straight from the top-surface of RF contact 202 where it contacts the MEMS element when pulled into contact down to the RF electrode 102. Once the electrically conductive materials 108, 110 have been patterned, the remainder of the processing may occur to form the MEMS ohmic switch shown in FIG. 3E.

Due to the direct connection between the RF contact and the RF electrode, the switch does not suffer from a high current running through the thin sidewall. The switch is robust and not prone to failure.

While the foregoing is directed to embodiments of the present disclosure, other and further embodiments of the disclosure may be devised without departing from the basic scope thereof, and the scope thereof is determined by the claims that follow.

The invention claimed is:

1. A MEMS device, comprising:
a substrate having a plurality of electrodes formed therein, wherein the plurality of electrodes includes at least an anchor electrode, a pull-down electrode and an RF electrode;
an insulating layer disposed over the substrate and the plurality of electrodes, wherein the insulating layer has a first opening formed therethrough to expose the anchor electrode and a second opening formed therethrough to expose the RF electrode;
a contact layer that is electrically conductive, wherein the contact layer includes a first portion disposed within the first opening and in contact with the anchor electrode, and a second portion disposed within the second opening and in contact with the RF electrode and wherein the RF electrode has a first height at a location adjacent the second portion of the contact layer and a second height at a planar location in contact with the second portion of the contact layer, wherein the second height is greater than the first height; and
a switching element disposed over the insulating layer, wherein the switching element includes an anchor portion in contact with the first portion of the contact layer, a leg portion and a bridge portion and wherein the bridge portion is movable from a first position spaced from the second portion of the contact layer and a second position in contact with the second portion of the contact layer.

2. The MEMS device of claim 1, wherein both the contact layer and the anchor electrode comprise electrically conductive material and wherein the contact layer and the anchor electrode comprise different materials.

3. The MEMS device of claim 1, wherein the anchor electrode has a first width and the first portion of the contact layer has a second width and wherein the first width is greater than the second width.

4. The MEMS device of claim 1, wherein the first portion of the contact layer is spaced from the insulating layer.

5. The MEMS device of claim 1, wherein the first portion of the contact layer has a thickness that is greater than a thickness of the insulating layer.

6. The MEMS device of claim 1, wherein the anchor electrode has a third height at a location adjacent the first portion of the contact layer, a fourth height at a location in contact with the first portion of the contact layer and a fifth height at a location in contact with the insulating layer wherein the fourth height is greater than the third height.

7. The MEMS device of claim 6, wherein the fourth height is equal to the fifth height.

8. The MEMS device of claim 7, wherein the fourth height is equal to the second height.

9. A method of fabricating a MEMS device, comprising:
depositing an insulating layer over a substrate, the substrate having a plurality of electrodes formed therein, wherein the plurality of electrodes includes at least an anchor electrode, a pull-in electrode and an RF electrode;
removing at least a portion of the insulating layer to form a first opening that exposes at least a portion of the anchor electrode and to form a second opening that exposes at least a portion of the RF electrode;
depositing a contact layer over the insulating layer and within the first opening on the anchor electrode and within the second opening on the RF electrode;
removing a portion of the contact layer, wherein a first portion of the contact layer remains within the first opening on the anchor electrode such that a width of the first portion of the contact layer is less than a width of the first opening and wherein a second portion of the contact layer remains within the second opening on the RF electrode; and
forming a switching element over the substrate, wherein the switching element includes an anchor portion that is coupled to the first portion of the contact layer, wherein the switching element also includes a leg portion and a bridge portion, wherein the switching element is movable from a first position spaced from the second portion of the contact layer and a second position in contact with the second portion of the contact layer.

10. The method of claim 9, wherein removing a portion of the contact layer additionally includes removing at least a portion of the anchor electrode.

11. The method of claim 10, wherein removing a portion of the contact layer additionally includes removing at least a portion of the RF electrode.

12. The method of claim 9, wherein the anchor electrode has a first height at a location adjacent the first portion of the contact layer, a second height at a location in contact with the first portion of the contact layer and a third height at a location in contact with the insulating layer wherein the second height is greater than the first height.

13. The method of claim 12, wherein the second height is equal to the third height.

14. The method of claim 13, wherein the RF electrode has a fourth height at a location adjacent the second portion of the contact layer, wherein the RF electrode has a fifth height at a location in contact with the second portion and wherein the fifth height is greater than the fourth height.

15. The method of claim 14, wherein the fifth height is equal to the second height.

16. The method of claim 9, wherein both the contact layer and the anchor electrode comprise electrically conductive material and wherein the contact layer and the anchor electrode comprise different materials.

17. The method of claim 9, wherein the anchor electrode has a first width and the first portion of the contact layer has a second width and wherein the first width is greater than the second width.

18. The method of claim 9, wherein the first portion of the contact layer is spaced from the insulating layer.

19. A MEMS device, comprising:
a substrate having a plurality of electrodes formed therein, wherein the plurality of electrodes includes at least an anchor electrode, a pull-down electrode and an RF electrode;
an insulating layer disposed over the substrate and the plurality of electrodes, wherein the insulating layer has a first opening formed therethrough to expose the anchor electrode and a second opening formed therethrough to expose the RF electrode;
a contact layer that is electrically conductive, wherein the contact layer includes a first portion disposed within the first opening and in contact with the anchor electrode, and a second portion disposed within the second opening and in contact with the RF electrode; and a switching element disposed over the insulating layer, wherein the switching element includes an anchor portion in contact with the first portion of the contact layer, a leg portion and a bridge portion and wherein the bridge portion is movable from a first position spaced from the second portion of the contact layer and a second position in contact with the second portion of the contact layer;

wherein the anchor electrode has a first height at a location adjacent the first portion of the contact layer, a second height at a location in contact with the first portion of the contact layer and a third height at a location in contact with the insulating layer wherein the first height is less than the second height and the third height.

* * * * *

UNITED STATES PATENT AND TRADEMARK OFFICE
CERTIFICATE OF CORRECTION

PATENT NO. : 10,896,787 B2
APPLICATION NO. : 15/771026
DATED : January 19, 2021
INVENTOR(S) : Robertus Petrus Van Kampen et al.

Page 1 of 1

It is certified that error appears in the above-identified patent and that said Letters Patent is hereby corrected as shown below:

On the Title Page

Item (54) and in the Specification, Column 1, Line 1, replace "CONTACT IN RF-SWITCH" with --IMPROVED CONTACT IN RF-SWITCH--.

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*